(12) United States Patent
Son

(10) Patent No.: US 12,364,154 B2
(45) Date of Patent: Jul. 15, 2025

(54) FLEXIBLE ORGANIC LIGHT EMITTING DISPLAY APPARATUS

(71) Applicant: LG Display Co., Ltd., Seoul (KR)

(72) Inventor: Jicheol Son, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 498 days.

(21) Appl. No.: 17/850,362

(22) Filed: Jun. 27, 2022

(65) Prior Publication Data

US 2023/0005999 A1    Jan. 5, 2023

(30) Foreign Application Priority Data

Jun. 30, 2021   (KR) ........................ 10-2021-0085964

(51) Int. Cl.
| | | |
|---|---|---|
| *H10K 59/121* | (2023.01) | |
| *H10K 50/80* | (2023.01) | |
| *H10K 59/131* | (2023.01) | |
| *H10K 59/40* | (2023.01) | |
| *H10K 77/10* | (2023.01) | |
| *H10K 50/86* | (2023.01) | |
| *H10K 102/00* | (2023.01) | |

(52) U.S. Cl.
CPC ......... *H10K 77/111* (2023.02); *H10K 50/868* (2023.02); *H10K 59/121* (2023.02); *H10K 59/131* (2023.02); *H10K 59/40* (2023.02); *H10K 50/86* (2023.02); *H10K 2102/311* (2023.02)

(58) Field of Classification Search
CPC .. H10K 59/121; H10K 50/868; H10K 59/131; H10K 59/40; H10K 77/111; H10K 2102/311; H10K 50/86; H10K 59/12; Y02E 10/549; G06F 1/1616; G06F 1/1652; G09F 9/301; G09F 9/335
See application file for complete search history.

(56) References Cited

U.S. PATENT DOCUMENTS

| | | | |
|---|---|---|---|
| 10,725,498 | B2 | 7/2020 | Han et al. |
| 2018/0182829 | A1* | 6/2018 | Shin ..................... H10K 59/131 |
| 2019/0107866 | A1 | 4/2019 | Han et al. |
| 2021/0064088 | A1 | 3/2021 | Kim et al. |

FOREIGN PATENT DOCUMENTS

| | | |
|---|---|---|
| KR | 10-2019-0040518 A | 4/2019 |
| KR | 10-2019-0135173 A | 12/2019 |
| KR | 10-2021-0026590 A | 3/2021 |

* cited by examiner

*Primary Examiner* — Elias Ullah
(74) *Attorney, Agent, or Firm* — Fenwick & West LLP

(57) ABSTRACT

A flexible organic light-emitting display apparatus comprises a substrate comprising a first area including a plurality of pixels, a bending area that is bent and extends from one side of the first area, and a second area that extends from one side of the bending area and faces at least a portion of the first area, and a backplate on a rear of the substrate and in contact with the rear of the substrate and the backplate comprising a bending structure that reduces stress applied to the bending area of the substrate and repulsive force while the bending area of the substrate is bent.

23 Claims, 5 Drawing Sheets

FLEXIBLE ORGANIC LIGHT EMITTING DISPLAY APPARATUS

CROSS REFERENCE TO RELATED APPLICATION

The present application claims priority to Republic of Korea Patent Application No. 10-2021-0085964, filed on Jun. 30, 2021, which is incorporated by reference in its entirety.

BACKGROUND OF THE DISCLOSURE

Field of the Disclosure

The disclosure relates to a flexible organic light-emitting display apparatus, and more particularly to a flexible organic light-emitting display apparatus strengthened in the rigidity of a bending portion thereof.

Description of the Related Art

A display apparatus has recently been developed to have excellent characteristics including thin thickness, light weight, low power consumption, etc., and is widely applied to various fields.

A flexible organic light-emitting display (OLED) apparatus, also called a flexible organic light emitting diode display or an organic electroluminescent display apparatus, refers to an apparatus that emits light as electric charges are injected into an emissive layer (EML) formed between an electron injection electrode, (e.g., a cathode) and a hole injection electrode, (e.g., an anode), and excitons formed by a combination of electrons and holes are extinguished. Such a flexible organic light-emitting display apparatus can be formed even on a plastic or the like flexible substrate, has a high contrast ratio because it is a self-emissive type, has a response time of several microseconds (µs), is easy to realize a moving image, has no limitations to a view angle, is stable at low temperature, and has a driving circuit easily manufactured and designed because it can be driven by a relatively low voltage of 5V to 15V.

In the organic light-emitting display apparatus, the EML of organic material is disposed between two electrodes, (e.g., the anode and the cathode). When holes from the anode are injected into the EML and electrons from the cathode are injected into the EML, the injected electrons and holes are recombined to form the excitons in the EML, thereby emitting light.

In this case, the EML includes a host material and a dopant material that interact with each other. The host material serves to generate excitons based on electrons and holes and transfer energy to the dopant material, and the dopant material, which is a small amount of organic dye material to be added, serves to receive energy from the host material and convert the energy into light.

A flexible organic light-emitting display apparatus including an organic EML is encapsulated with glass, metal or a film to block inflow of water or oxygen from the outside, thereby preventing the EML and the electrode from being oxidized and protecting the EML and the electrode against mechanical or physical impact from the outside.

The organic light-emitting display apparatus does not need a separate light source and is thus suitable for a flexible display apparatus. In this case, plastic, thin-film metal film (e.g., metal foil), or the like flexible material is used as the substrate for the organic light-emitting display apparatus.

Meanwhile, research has been carried out to implement the organic light-emitting display apparatus as a flexible organic light-emitting display apparatus and bend or curve various portions of the display apparatus based on flexibility. Such research is being generally conducted for a new design, user interface/user experience (UI/UX), and efforts to reduce the thickness of the flexible organic light-emitting display apparatus are being continuously made.

Besides, efforts are also being continuously made to prevent wiring of the flexible organic light-emitting display apparatus from being cracked in an area where a flexible substrate is bent.

SUMMARY

The disclosure is to provide a structure for reducing the problem that wiring is cracked in a bending area of a substrate in flexible organic light-emitting display apparatus.

Further, the disclosure is to provide a structure for strengthening the rigidity of a bending area in flexible organic light-emitting display apparatus.

Subject matters in the disclosure are not limited to the subject matters mentioned above, and other subject matters not mentioned will be clearly understood by those skilled in the art from the following description.

In one embodiment, a flexible organic light-emitting display apparatus comprises: a substrate comprising a first area including a plurality of pixels, a bending area that is bent and extends from one side of the first area, and a second area that extends from one side of the bending area and faces at least a portion of the first area; and a backplate on a rear of the substrate and in contact with the rear of the substrate, the backplate comprising a bending structure that reduces stress applied to the bending area of the substrate and repulsive force while the bending area of the substrate is bent.

In one embodiment, a flexible organic light-emitting display apparatus comprises: a substrate comprising a first area including a plurality of pixels, a second area that faces the first area and including a pad portion, and a bending area that is bent and is between the first area and the second area, the bending area including a plurality of wires that extend from the first area to the second area; and a backplate in contact with a surface of the substrate, the backplate including a first portion that overlaps the first area of the substrate, a second portion that overlaps the second area of the substrate, and a bendable backplate portion that overlaps the bending area of the substrate, the bendable backplate portion more bendable than the first portion and the second portion of the backplate.

Detailed matters of other embodiments are included in the detailed description and the accompanying drawings.

According to embodiments of the disclosure, a bending structure having plurality slit patterns is provided in a bending portion of a backplate placed on a rear surface of a substrate, thereby preventing damage or deformation when the external force is applied to a bending area of the substrate. In other words, it is possible to secure the rigidity of the bending area of the substrate. Further, due to the bending structure from which the backplate is partially removed, repulsive force is more decreased than that of no bending structure so that the backplate can maintain curvature without being folded.

Matters of the disclosure described in problems to be solved, means for solving the problem, and effects do not specify the essential features of claims, and therefore the scope of claims are not limited by the described matters.

DETAILED DESCRIPTION

Figure 1:
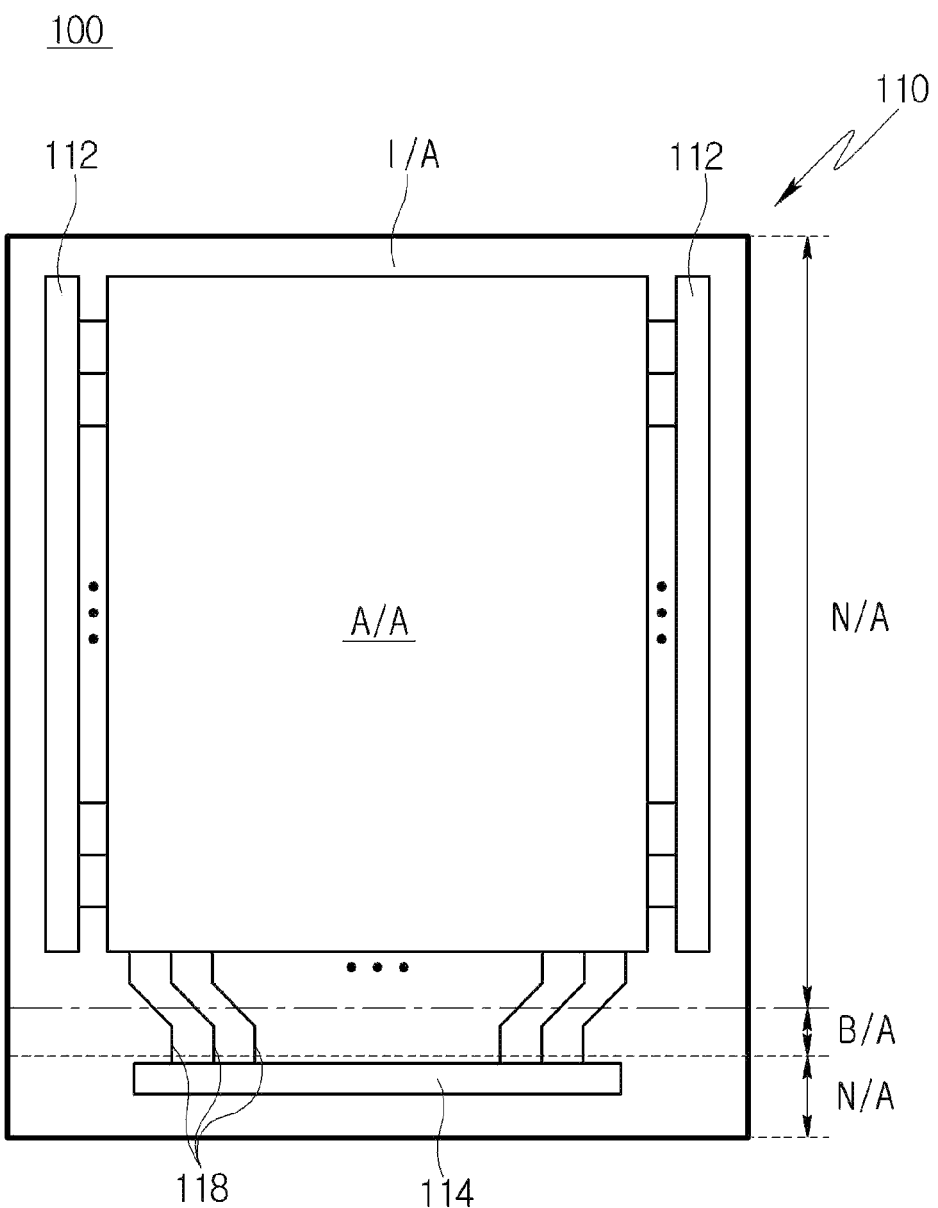
FIG. 1 is a plan view schematically illustrating an exemplary flexible organic light-emitting display apparatus that may be included in an electronic apparatus according to one embodiment.

Advantages and characteristics of the present disclosure, and a method of achieving the advantages and characteristics will be clear by referring to the embodiments described below in detail together with the accompanying drawings. However, the present disclosure is not limited to the embodiment disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other elements to be added unless the terms are used with the term "only". Any references to singular may include plural unless expressly stated otherwise.

Elements are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

The size and a thickness of each component illustrated in the drawing are illustrated for convenience of description, and the present disclosure is not limited to the size and the thickness of the component illustrated.

The features in various embodiments of the disclosure may be partially or fully coupled or combined with each other, and technically linked and operated as understood by those skilled in the art, and the embodiments may be implemented independently of each other or together under a relationship.

Below, embodiments of the disclosure will be described in detail with reference to the accompanying drawings.

FIG. 1 is a plan view showing an exemplary flexible organic light-emitting display apparatus that may be included in an electronic apparatus according to one embodiment.

A flexible organic light-emitting display apparatus refers to a flexible organic light-emitting display apparatus having flexibility, and is used in a similar sense to a bendable organic light-emitting display apparatus, a rollable organic light-emitting display apparatus, an unbreakable organic light-emitting display apparatus, a foldable organic light-emitting display apparatus, etc.

A flexible organic light-emitting display apparatus 100 includes at least one active area A/A, and an array of pixels is formed in the active area A/A. One or more inactive areas I/A may be disposed around the active area A/A. For example, the inactive area I/A may be adjacent to one or more sides of the active area A/A.

The inactive area I/A surrounds a quadrangular active area. However, the shape of the active area A/A and the shape/layout of the inactive area I/A adjacent to the active area A/A are not limited to the example shown in FIG. 1.

The shapes of the active area A/A and inactive area I/A may be suitable for designing an electronic apparatus with the flexible organic light-emitting display apparatus 100. The active area A/A may, for example, be shaped like a pentagon, a hexagon, a circle, an oval, or the like, but not limited thereto.

Pixels in the active area A/A may be connected to pixel circuits. The pixel circuits may include one or more switching transistors and one or more driving transistors on a backplane. Each pixel circuit may be electrically connected to gate lines and data lines to communicate with one or more driving circuits, such as a gate driver and a data driver provided in the inactive area.

A driver 112 may be embodied as a thin-film transistor (TFT) in the inactive area I/A. The driver 112 may be called a gate-in-panel (GIP). Further, some parts such as a data driver integrated circuit (IC) may be mounted to a printed circuit board. A flexible printed circuit board (FPCB), a chip on film (COF), a tape-carrier-package (TCP) or the like circuit film may be used to couple with a connection interface (e.g., a pad, a bump, a pin, etc.) provided in the inactive area I/A.

The flexible organic light-emitting display apparatus 100 may include various additional elements for generating various signals or driving the pixels in the active area A/A. The additional elements for driving the pixels may include an inverter circuit, a multiplexer, an electrostatic discharge (ESD) circuit, etc. The flexible organic light-emitting display apparatus 100 may also include additional elements related to functions other than the function of driving the pixels. For example, the flexible organic light-emitting display apparatus 100 may include additional elements for implanting a touch sensing function, a user authentication function (e.g., fingerprint recognition), a multilevel pressure sensing function, a tactile feedback function, etc. The additional elements mentioned above may be placed in the inactive area I/A and/or an external circuit connected to the connection interface.

A flexible substrate 110 may be made of a flexible material to be bendable. For example, the flexible substrate 110 may be provided as a thin plastic film made of polyimide, polyethylene naphthalate (PEN), polyethylene terephthalate (PET) or the like polymer, but not limited thereto. Therefore, the flexible substrate 110 is bendable. For example, the flexible substrate 110 is bendable in a horizontal, vertical or diagonal direction. Therefore, the flexible substrate 110 may be bendable in a combination of the vertical, horizontal and diagonal directions based on a design required for the flexible display apparatus 100, but there are no limits to a bending direction.

The flexible substrate 110 includes a first area, a bending area B/A extended from one side of the first area, and a second area extended from one side of the bending area. The first area may be defined as a non-bending area N/A including the active area A/A, and the second area may be defined as a non-bending area N/A including the inactive area I/A placed opposite to the first area with respect to the bending area.

The flexible substrate 110 may be partially bent, for example, in a lower end portion of the active area as shown in FIG. 1. For example, the flexible substrate 110 may be bent in the bending area B/A so that the second area can be folded behind the first area.

In addition, FIG. 1 shows that the inactive area I/A of the flexible substrate 110 is bent, and the active area of the flexible substrate 110 is partially bent. In this case, an image may be displayed in a bent area of the active area, and the flexible display apparatus 100 may include a substantially flat active area and a bent active area.

In the inactive area I/A of the second area of the flexible substrate 110, a pad portion 114 or a similar interface is provided. As shown in FIG. 1, the pad portion 114 may, for example, be provided in the inactive area I/A adjacent to the bending area B/A in the lower end portion of the flexible substrate 110. The pad portion 114 is connected to the FPCB or the like circuit film, and may include a connection terminal for connecting the circuit film and a wiring 118.

A thin film transistor connecting with a flexible organic light-emitting diode in the active area is provided. The thin-film transistor operates in connection with the driver 112 placed in the inactive area and controls the amount of driving current supplied to the organic light-emitting diode.

The driver 112 is placed in the inactive area I/A of the flexible substrate 110, and provides a driving signal to the thin film transistor. For example, the driver 112 may be a gate driver that provides a gate signal to the thin film transistor. The driver 112 includes various gate driving circuits, and the gate driving circuits may be directly formed on the flexible substrate 110. In this case, the driver 112 may also be called a gate-in-panel (GIP).

The data driver for providing a data signal to the thin film transistor may be mounted to a printed circuit board (PCB) and connected to the flexible substrate 110 through the FPCB or the like circuit film or may be directly formed in the pad portion 114 of the flexible substrate 110 like the COF.

Figure 2:
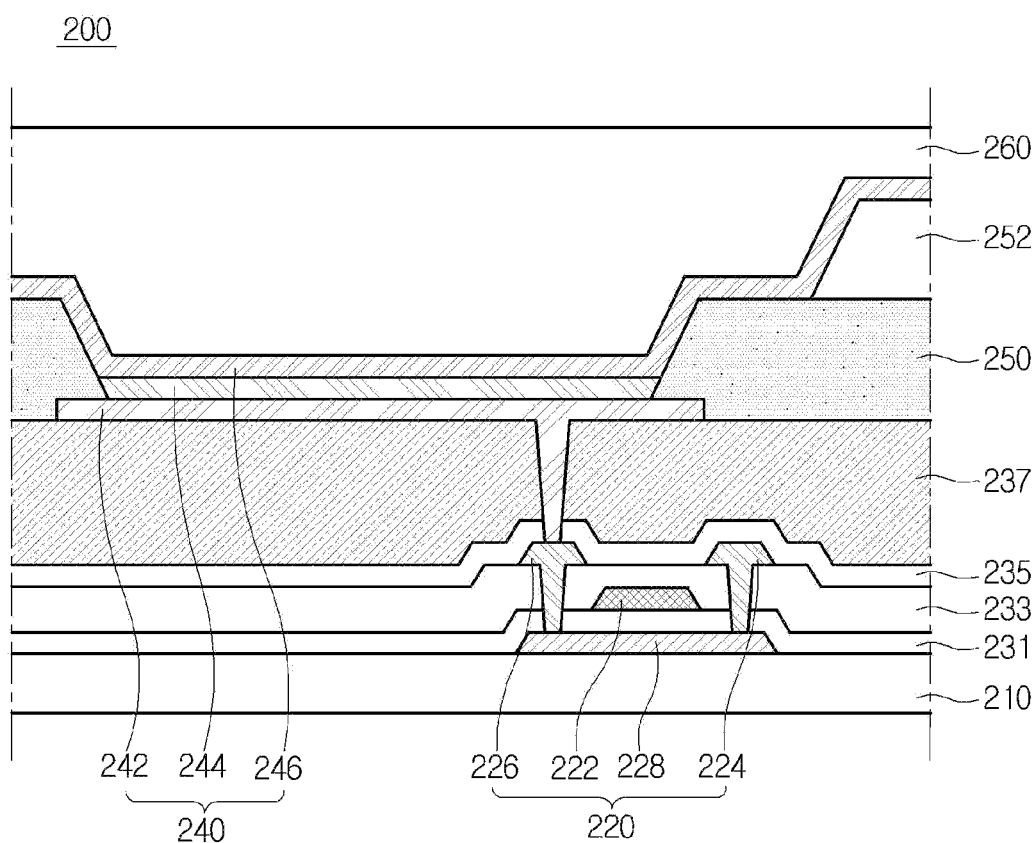
FIG. 2 is a partial cross-sectional view schematically illustrating a pixel included in flexible organic light-emitting display apparatus according to an embodiment of the disclosure.

FIG. 2 is a partial cross-sectional view of a pixel included in a flexible organic light-emitting display apparatus according to an embodiment of the disclosure.

A flexible organic light-emitting display apparatus 200 may include a base layer 210, a thin film transistor 220, a flexible organic light emitting diode 240, and an encapsulating portion 260. The base layer 210 serves to support and protect the elements of the organic light-emitting display apparatus 200, which are placed in an upper portion of the flexible organic light-emitting display apparatus 200, and is made of a soft material having flexibility. The base layer 210 may be a flexible substrate.

For example, the flexible substrate may be provided in the form of a film including one of a polyester-based polymer, a silicon-based polymer, an acrylic-based polymer, a polyolefin-based polymer, and a copolymer thereof. In particular, the flexible substrate may include at least one of polyethylene terephthalate (PET), polybutyleneterephthalate (PBT), polysilane, polysiloxane, polysilazane, polycarbosilane, polyarcylate, polymethacrylate, polymethylarcylate, polymethylmethacrylate, polyethylarcylate, polyethylmethacrylate, cyclic olefin copolymer (COC), cyclic olefin polymer (COP), polyethylene (PE), polypropylene (PP), polyimide (PI), polymethylmethacrylate (PMMA), polystyrene (PS), polyacetal (POM), polyetheretherketone (PEEK), polyestersulfone (PES), polytetrafluoroethylene (PTFE), polyvinylchloride (PVC), polycarbonate (PC), polyvinylidenefluoride (PVDF), perfluoroalkyl polymer (PFA), styreneacrylonitrilecopolymer (SAN) and combination thereof.

Further, a buffer layer may be formed and disposed on the base layer 210. The buffer layer may prevent or at least reduce penetration of water or other impurities into the base layer 210, and planarize the surface of the base layer 210. The buffer layer is non-essential and may not be provided according to the base layer 210 or the kinds of thin-film transistor 220 disposed on the base layer.

The thin film transistor 220 disposed on the base layer 210 includes a gate electrode 222, a source electrode 224, a drain electrode 226, and a semiconductor layer 228.

The semiconductor layer 228 may be made of amorphous silicon or polycrystalline silicon, which is applicable to a driving thin film transistor in pixels because it has better mobility, consumes less power and is more reliable than amorphous silicon, but is not limited thereto.

Recently, an oxide semiconductor has been in the limelight because it is excellent in mobility and uniformity. The oxide semiconductor may be made of quaternary metal oxide, (e.g., an indium tin gallium zinc oxide (InSnGaZnO)-based material), ternary metal oxide, (e.g., an indium gallium zinc oxide (InGaZnO)-based material), an indium tin zinc oxide (InSnZnO)-based material, indium aluminum zinc oxide (InAlZnO)-based material, tin gallium zinc oxide (SnGaZnO)-based material, aluminum gallium zinc oxide (AlGaZnO)-based material, or tin aluminum zinc oxide (SnAlZnO)-based material; and binary metal oxide, i.e., indium zinc oxide (InZnO)-based material, tin zinc oxide (SnZnO)-based material, aluminum zinc oxide (AlZnO)-based material, zinc magnesium oxide (ZnMgO)-based material, tin magnesium oxide (SnMgO)-based material, indium magnesium oxide (InMgO)-based material, indium gallium oxide (InGaO)-based material, indium oxide (InO)-based material, tin oxide (SnO)-based material, zinc oxide (ZnO)-based material, or etc., and there are no limits to element composition ratios.

The semiconductor layer 228 may include source and drain regions with p-type or n-type impurities, a channel between the source and drain regions, and may include a doping region having a low concentration and provided between the source and drain regions adjacent to the channel.

A gate insulating layer 231 is an insulating film formed as a single layer or multiple layers of silicon oxide (SiOx) or silicon nitride (SiNx), and disposed to prevent or at least reduce a current flowing in the semiconductor layer 228 from flowing toward the gate electrode 222. Further, silicon oxide is harder than metal but softer than silicon nitride. Silicon oxide may be formed as the single layer or the multiple layers according to its characteristics.

The gate electrode 222 serves as a switch to turn on or off the thin film transistor 220 based on an electrical signal received from the outside through the gate lines, and may be formed as a single layer or multiple layers of conductive metal such as copper (Cu), aluminum (Al), molybdenum (Mo), chrome (Cr), gold (Au), titanium (Ti), nickel (Ni), neodymium (Nd), etc. or an alloy thereof, but not limited thereto.

The source electrode 224 and the drain electrode 226 are connected to the data lines and transmit external electric signals from the thin film transistor 220 to the organic light emitting diode 240. The source electrode 224 and the drain electrode 226 may be formed as single layers or multiple layers of conductive metal such as copper (Cu), aluminum (Al), molybdenum (Mo), chrome (Cr), gold (Au), titanium (Ti), nickel (Ni), neodymium (Nd), etc. or an alloy thereof, but not limited thereto.

To insulate the gate electrode 222, the source electrode 224, and the drain electrode 226 from one another, an interlayer insulating layer 233 formed as a single layer or multiple layers of silicon oxide (SiOx) or silicon nitride (SiNx) may be provided among the gate electrode 222, the source electrode 224, and the drain electrode 226.

A passivation layer 235 formed as an inorganic insulating film such as silicon oxide (SiOx) or silicon nitride (SiNx) is disposed on the thin film transistor 220. The passivation layer 235 may prevent or at least reduce the elements of the thin film transistor 220 from unnecessary electrical connections therebetween and contamination, damage, etc., of the outside. The passivation layer 235 may be omitted according to the configurations and characteristics of the thin film transistor 220 and the organic light emitting diode 240.

The thin film transistor 220 may have an inverted staggered structure or a coplanar structure classified according to the positions of the elements provided in the thin film transistor 220. In the thin film transistor having the inverted staggered structure, the gate electrode is positioned opposite the source and drain electrodes with respect to the semiconductor layer.

In the thin-film transistor 220 having the coplanar structure as shown in FIG. 2, the gate electrode 222 is positioned on the same side as the source electrode 224 and the drain electrode 226 with respect to the semiconductor layer 228.

FIG. 2 shows the thin film transistor 220 of the coplanar structure, but the organic light-emitting display apparatus may include the thin film transistor having the inverted staggered structure.

For the convenience of description, only the driving thin film transistor is illustrated among various thin-film transistors for the organic light-emitting display apparatus, but a switching thin film transistor, a capacitor, etc., may be included in the organic light-emitting display apparatus. In this case, when the switching thin film transistor receives a signal from gate wiring, a signal from data wiring is transmitted to the gate electrode of the driving thin film transistor. In response to the signal received from the switching thin film transistor, the driving thin film transistor transmits a current received from through power wiring to an anode, thereby controlling light emission based on the current transmitted to the anode.

To protect the thin film transistor 220, relieve a height difference due to the thin film transistor 220, and decrease the parasitic capacitance between the thin film transistor 220 and the gate and data lines, and between the organic light emitting diodes 240, a planarization layer 237 is disposed on the thin film transistor 220.

The planarization layer 237 may be made of one or more among acrylic resin, epoxy resin, phenolic resin, polyamides resin, polyimides resin, unsaturated polyesters resin, polyphenylene resin, polyphenylenesulfides resin, and benzocyclobutene, but not limited thereto.

The organic light emitting diode 240 disposed on the planarization layer 237 includes an anode 242, a light emitter 244, and a cathode 246.

The anode 242 may be disposed on the planarization layer 237. In this case, the anode 242 refers to an electrode that serves to supply holes to the light emitter 244, and is electrically connected to the thin film transistor 220 through a contact hole formed in the planarization layer 237.

The anode 242 may be made of a transparent conductive material such as indium tin oxide (ITO), indium zinc oxide (IZO), etc., but not limited thereto.

When the organic light-emitting display apparatus 200 is a top emission type in which light is emitted toward a top where the cathode 246 is disposed, a reflective layer may further be provided so that emitted light can be reflected from the anode 242 and more smoothly emitted in an upward direction where the cathode 246 is disposed. Further, the anode 242 may have a two-layered structure where a transparent conductive layer of a transparent conductive material and the reflective layer are stacked in sequence, or a three-layered structure where a transparent conductive layer, the reflective layer, and a transparent conductive layer are stacked in sequence. The reflective layer may be made of silver (Ag) or an alloy that includes silver.

A bank 250 disposed on the anode 242 and the planarization layer 237 may define a pixel that divides a region where light is actually emitted. After forming a photoresist on the anode 242, the bank 250 is formed by photolithography. The photoresist refers to a photosensitive resin of which solubility in a developing solution is varied depending on the action of light. The photoresist is exposed to light and developed to form a specific pattern. The photoresist may be classified into positive photoresists and negative photoresists. The positive photoresist refers to a photoresist of which an exposed portion is increased in the solubility in the developing solution by exposure, and the exposed portion is removed to form a pattern when the positive photoresist is developed. The negative photoresist refers to a photoresist of which an exposed portion is significantly decreased in the solubility in the developing solution by exposure, and an unexposed portion is removed to form a pattern when the negative photoresist is developed.

To form the light emitter 244 of the organic light emitting diode 240, a deposition mask (e.g., a fine metal mask (FMM)) may be used. In this case, a spacer 252 made of a transparent organic material, (e.g., one of polyimide, photoacryl, and benzocyclobutene (BCB)) may be disposed on the bank 250 so as to prevent or at least reduce damage that may be caused by contact with the deposition mask disposed on the bank 250 and to keep a constant distance between the bank 250 and the deposition mask.

The light emitter 244 is disposed between the anode 242 and the cathode 246. The light emitter 244, which serves to emit light, may include at least one layer among a hole injection Layer (HIL), a hole transport layer (HTL), an emission layer (EML), an electron transport layer (ETL), and an electron injection layer (EIL), and may exclude some elements among them according to the structures or characteristics of the organic light-emitting display apparatus 200. Here, the EML may employ an organic EML and an inorganic EML.

The HIL is disposed on the anode 242 and serves to smoothly inject holes. The HIL may for example include one or more HAT-CN (dipyrazino[2,3-f:2',3'-h]quinoxaline-2,3,6,7,10.11-hexacarbonitrile), CuPc (phthalocyanine), and NPD (N,N'-bis(naphthalene-1-yl)-N,N'-bis(phenyl)-2,2'-dimethylbenzidine).

The HTL is disposed on the HIL and serves to smoothly transport the holes to the EML. The HTL may for example include one or more among NPD (N,N'-bis(naphthalene-1-yl)-N,N'-bis(phenyl)-2,2'-dimethylbenzidine), TPD (N,N'-bis-(3-methylphenyl)-N,N'-bis-(phenyl)-benzidine), s-TAD (2,2',7,7'-tetrakis(N,N-dimethylamino)-9,9-spirofluorene), and MTDATA (4,4',4"'-Tris(N-3-methylphenyl-N-phenyl-amino)-triphenylamine).

The EML is disposed on the HTL and includes a light emitting material for a specific color to emit light of a specific color. In this case, the light emitting material may include a phosphorescent material or a fluorescent material.

When the EML emits light of a red color, the EML has an emission peak wavelength ranging from 600 nm to 650 nm, and may include a host material that includes CBP (4,4'-bis(carbazol-9-yl)biphenyl) or mCP (1,3-bis(carbazol-9-yl)benzene), and a phosphorescent material that includes one or more dopants among PIQIr(acac)(bis(1-phenylisoquinoline) (acetylacetonate) iridium), PQIr(acac)(bis(1-phenylquinoline)(acetylacetonate) iridium), PQIr(tris(1-phenylquinoline) iridium) and PtOEP(octaethylporphyrin platinum). Alternatively, the EML may include a fluorescent material that includes PBD:Eu (DBM)3 (Phen) or Perylene.

Here, the peak wavelength λ refers to the maximum wavelength of electroluminescence (EL). A wavelength, at which the emission layers of the light emitter emit unique light, is called a wavelength of photoluminescence (PL), and light emitted as affected by the thickness of or optical properties of the emission layers is called emittance. In this case, the EL refers to light finally emitted by the organic light-emitting display apparatus, and may be expressed as the PL and the emittance.

When the EML emits light of a green color, the EML has an emission peak wavelength ranging from 520 nm to 540 nm, and may include a host material that includes CBP or mCP, and a phosphorescent material that includes a dopant such as an Ir complex that includes Ir(ppy)3(tris(2-phenylpyridine)iridium). Alternatively, the EML may include a fluorescent material that includes Alq3(tris(8-hydroxyquinoline)aluminum).

When the EML emits light of a blue color, the EML has an emission peak wavelength ranging from 440 nm to 480 nm, and may include a host material that includes CBP or mCP, and a phosphorescent material that includes a dopant that includes FIrPic (bis(3,5-difluoro-2-(2-pyridyl)phenyl-(2-carboxypyridyl)iridium). Further, the EML may include a fluorescent material that includes one of spiro-DPVBi (4,4'-Bis(2,2-diphenyl-ethen-1-yl)biphenyl), DSA (1-4-di-[4-(N, N-diphenyl) amino]styryl-benzene), a polyfluorene (PFO) polymer, and a polyphenylenevinylene (PPV) polymer.

The ETL is disposed on the EML and smoothly moves electrons to the EML.

The ETL may for example include one or more among Liq (8-hydroxyquinolinolato-lithium), PBD (2-(4-biphenyl)-5-(4-tert-butylphenyl)-1,3,4-oxadiazole), TAZ (3-(4-biphenyl)4-phenyl-5-tert-butylphenyl-1,2,4-triazole), spiro-PBD, BCP (2,9-Dimethyl-4,7-diphenyl-1,10-phenanthroline) and BAlq(bis(2-methyl-8-quinolinolate)-4-(phenylphenolato)aluminum).

The EIL may further be disposed on the ETL. The EIL refers to an organic layer that smoothly injects electrons from the cathode 246, and may be excluded according to the structures and characteristics of a flexible organic light-emitting display apparatus 200. The EIL may include a metal inorganic compound such as $BaF_2$, LiF, NaCl, CsF, $Li_2O$ and BaO, and may include one or more organic compounds among HAT-CN (dipyrazino[2,3-f:2',3'-h]quinoxaline-2,3,6,7,10.11-hexacarbonitrile), CuPc (phthalocyanine), and NPD (N,N'-bis(naphthalene-1-yl)-N,N'-bis(phenyl)-2,2'-dimethylbenzidine).

An electron or hole blocking layer for blocking flow of holes or electrons may further be disposed adjacent to the EML, and thus improve an emission efficiency by preventing the electrons from moving from the EML and passing through the adjacent HTL when the electrons are injected into the EML or preventing the holes from moving from the EML and passing through the adjacent ETL when the holes are injected into the EML.

The cathode 246 is disposed on the light emitter 244, and serves to supply electrons to the light emitter 244. In order to supply the electrons, the cathode 246 may include a conductive material having a low work function, such as magnesium (Mg), silver-magnesium (Ag:Mg) or the like metal material, but is not limited thereto. Alternatively, when the organic light-emitting display apparatus 200 is the top emission type, the cathode 246 may include indium tin oxide (ITO), indium zinc oxide (IZO), indium tin zinc oxide (ITZO), zinc oxide (ZnO), tin oxide (TiO), or the like transparent conductive oxide.

An encapsulating portion 260 may be disposed on the organic light emitting diode 240 to prevent or at least reduce the elements of the organic light-emitting display apparatus 200, such as the thin film transistor 220 and the organic light emitting diode 240, from being oxidized or damaged by water, oxygen or impurities introduced from the outside. The encapsulating portion 260 may be formed by stacking a plurality of encapsulation layers, a foreign material compensation layer, and a plurality of barrier films.

The encapsulation portion 260 is disposed on the entire top surface of a thin film transistor 220 and the organic light emitting diode 240, and may include one of the inorganic materials such as silicon nitride (SiNx) and aluminum oxide (AlyOz), but is not limited thereto. On the foreign material compensation layer disposed on the encapsulation layer, another encapsulation layer may be additionally stacked and disposed.

The foreign material compensation layer is disposed on the encapsulation layer and may include organic material such as silicon oxycarbon (SiOCz), acryl or epoxy resin, but is not limited thereto. When a crack generated by foreign materials or particles causes a defect during a process, such unevenness and the foreign materials are covered and compensated with the foreign material compensation layer.

The barrier films are disposed on the encapsulation layer and the foreign material compensation layer, so that a flexible organic light-emitting display apparatus 200 can further delay penetration of oxygen and water from the outside. The barrier film may be provided in the form of a permeable and double-sided adhesive film, and may include one of olefin-based, acrylic-based and silicon-based insulating materials. Alternatively, another barrier film that includes one of copolyester thermoplastic elastomer (COP), cycoolefin copolymer (COC), and polycarbonate (PC) may be further stacked, but not limited thereto.

Figure 3:
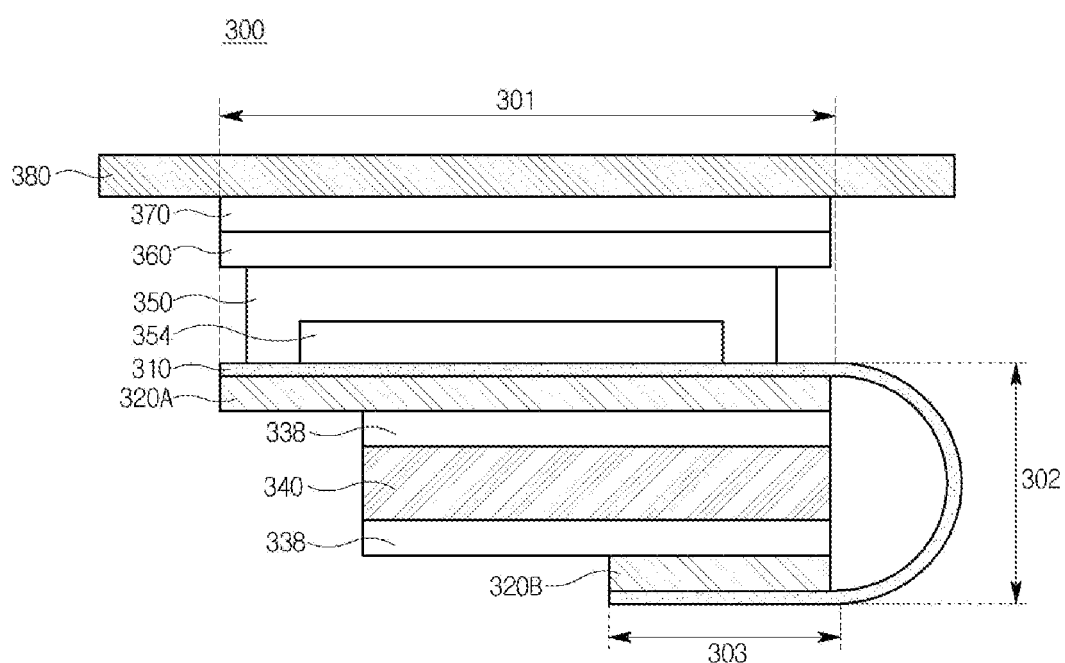
FIG. 3 is a cross-sectional view schematically illustrating flexible organic light-emitting display apparatus according to an embodiment of the disclosure.

FIG. 3 is a cross-sectional view showing a stacked structure of a flexible organic light-emitting display apparatus according to another embodiment of the disclosure.

A flexible substrate 310 includes a first area 301, a bending area 302 extending from one side of the first area 301, and a second area 303 extending from one side of the bending area 302 away from the first area 301. The first area 301 may be defined as a non-bending area N/A including an active area A/A, and the second area may be defined as a non-bending area N/A including an inactive area I/A placed opposite to the first area 301 with respect to the bending area 302.

To increase the strength and/or solidity in a specific portion of the flexible organic light-emitting display apparatus 300, one or more backplates such as a first backplate 320A and a second backplate 320B, may be provided in a lower portion, for example, on the back of the flexible substrate 310. The first backplate 320A may be provided on a rear surface of the first area 301, and the second backplate 320B may be provided on a rear surface of the second area 303. The first and second backplates 320A and 320B may not be provided in the bending area 302, which requires greater flexibility. When the flexible substrate 310 has greater elasticity than the backplates 320A and 320B, the backplates 320A and 320B may suppress a crack or the like damage in the flexible substrate 310. The backplates 320A and 320B may include one among polyethylene terephthalate (PET), cyclic olefin polymer (COP), and triacetyl cellulose (TAC).

As shown in FIG. 3, the first backplate 320A is adhered to the active area 301 of the flexible substrate 310, and the second backplate 320B is adhered to the inactive area 303. In addition, a supporting member 340 is provided between the first backplate 320A adhered to the active area 301 of the flexible substrate 310 and the second backplate 320B adhered to the inactive area 303. The supporting member 340 may partially extend up to the bending area 302.

A flexible organic light emitting diode layer 354 is provided on the active area 301 of the flexible substrate 310, an encapsulation layer 350 is provided on the organic light emitting diode layer 354, a polarization layer 360 is provided on the encapsulation layer 350, and a cover window 380 is provided on the polarization layer 360.

Here, the backplate includes the first backplate 320A and the second backplate 320B. The first backplate 320A may be adhered to one surface of the active area 301 of the flexible substrate 310 and support the flexible substrate 310, and the second backplate 320B may be adhered to one surface of the inactive area of the flexible substrate 310 and support the flexible substrate 310.

The supporting member 340 has a first surface adhered to the first backplate 320A that is adhered to the active area 301 of the flexible substrate 310, and a second surface adhered to the second backplate 320B adhered to the inactive area 303. An adhesive 338 may be interposed between the supporting member 340 and the first backplate 320A and between the supporting member 340 and the second backplate 320B.

Thus, the supporting member 340 is additionally provided to support the first backplate 320A of the active area 301 and the second backplate 320B of the inactive area 303.

The bending area 302 may have a bending angle and a bending radius with respect to a bending axis and may be bent outward from the active area 301.

Some portions of the flexible display apparatus 300 may be exposed to external light during the manufacturing process. A material used in manufacturing parts or the parts themselves may be exposed to light while the flexible display apparatus 300 is manufactured. Thus, such portions undergo undesired state changes (e.g., threshold voltage transitions in the TFT, etc.). Some portions of the flexible display apparatus 300 are excessively exposed to external light as compared with other portions. Further, this may cause display nonuniformities (e.g., mura, shadow defects, etc.). To nonuniformities, the flexible substrate 310 and/or the backplate may include one or more materials capable of reducing the amount of external light.

Referring to FIG. 3, the organic light emitting diode layer 354 is disposed on the flexible substrate 310. The organic light emitting diode layer 354 includes a plurality of organic light emitting diodes. The organic light emitting diodes are controlled by a pixel circuit and a driving circuit provided on the flexible substrate 310, and another external driving circuit connected to a connection interface on the flexible substrate 310. The organic light emitting diode layer 354 includes a flexible organic light emitting material layer that emits light of specific colors (e.g., red, green, and blue). According to some embodiments, the organic light emitting material layer may include a stacked structure capable of emitting white light, for example, a combination of light of several colors.

The encapsulation layer 350 is provided to protect the organic light emitting diode layer 354 against air and moisture from the outside. The encapsulation layer 350 may include several material layers to reduce air and moisture penetration. According to some embodiments, the encapsulation layer 350 may be provided in the form of a thin film, for example, a barrier film.

The flexible display apparatus 300 may include the polarization layer 360 to control display characteristics (e.g., external light reflection, color accuracy, brightness, etc.). Further, the cover window 380 may be used on the polarization layer 360 to protect the flexible display apparatus 300.

An electrode for detecting a user's touch input may be formed inside one surface of the cover window 380 and/or at least one surface of the polarization layer 360. As necessary, a touch detection electrode and/or an independent layer including other parts related to touch input detection (hereinafter referred to as a touch sensor layer 370) may be provided inside the flexible display apparatus 300.

The touch sensor layer 370 may include one or more transformable dielectric materials. One or more electrodes may interface with the touch sensor layer 370, or be located around the touch sensor layer 370, and read a signal that measures electrical change on the electrodes.

This measurement is analyzed and the amount of pressure input to the flexible display apparatus 300 is evaluated into various levels.

According to some embodiments, the touch detection electrodes may be used to identify the position of user input and evaluate the pressure of user input. The touch input position identification and the touch pressure measurement may be performed by measuring a change in capacitance of the touch detection electrodes provided on one surface of the touch sensor layer 370. The touch detection electrode and/or other electrodes may be used in measuring a signal showing the pressure on the flexible display apparatus 300 based on the touch input. Such a signal is obtained from the touch detection electrode at the same time as or different timing from a touch signal.

Various other elements, for example, the polarization layer 360, the touch sensor layer 370, etc., may not be provided in the bending area.

In the embodiment of FIG. 3, the inventors have discovered a problem with the flexible display apparatus 300 having the foregoing structure including the supporting member 340 and the backplates 320A and 320B. In other words, an attaching process for the first backplate 320A and the second backplate 320B is as follows. First, the backplate formed of polyethylene terephthalate (PET) is attached to the entire rear surface of the flexible substrate. After the attachment, the backplate is partially removed corresponding to the bending area of the flexible substrate so that the flexible substrate can be bent. In this case, a laser is used, and a laser cutting condition needs to be precisely controlled for a cutting size of the backplate. However, the low precision of laser cutting may cause an uneven cut surface. Further, the backplate is removed from the rear of the substrate corresponding to the bending area in consideration of the curvature of the bending area in the flexible substrate 310, thereby lowering the rigidity of the bending area. When the external force is applied to the bending area of which the rigidity is lowered, the bending area may be damaged due to stress acting on the substrate. Accordingly, the present inventors devised an improved structure for solving the foregoing problems.

Figure 4:
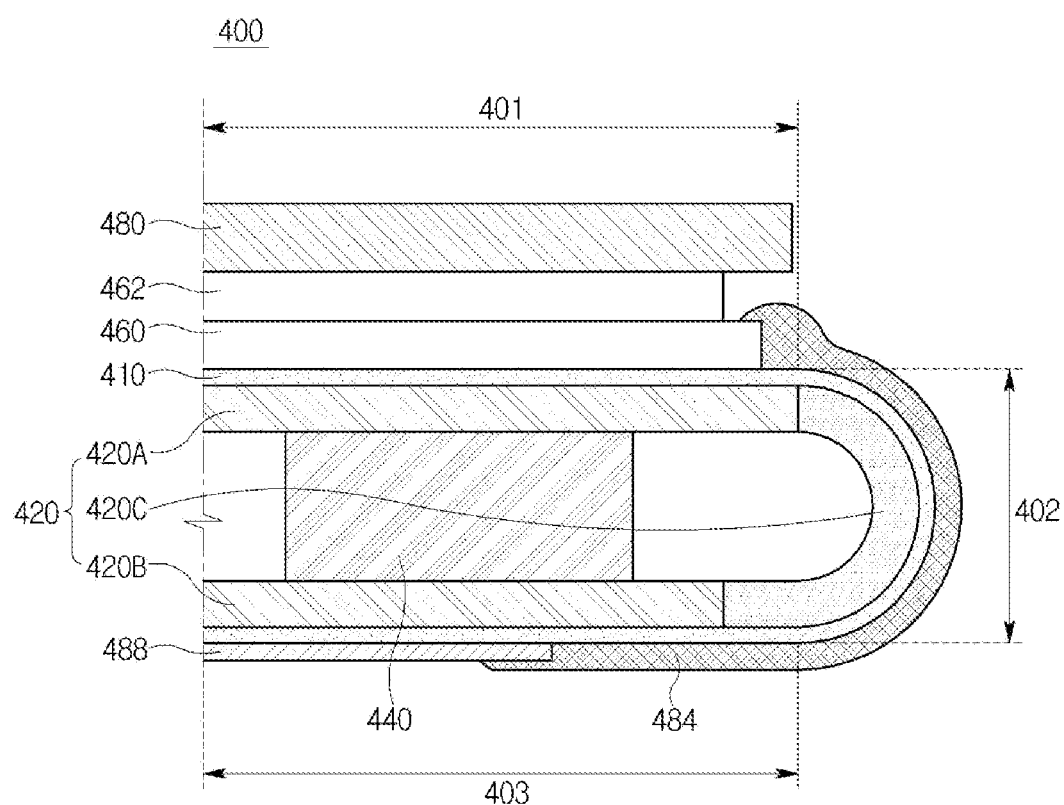
FIG. 4 is a partial cross-sectional view schematically illustrating a stacked structure of a flexible organic light-emitting display apparatus according to an embodiment of the disclosure.
Figure 5:
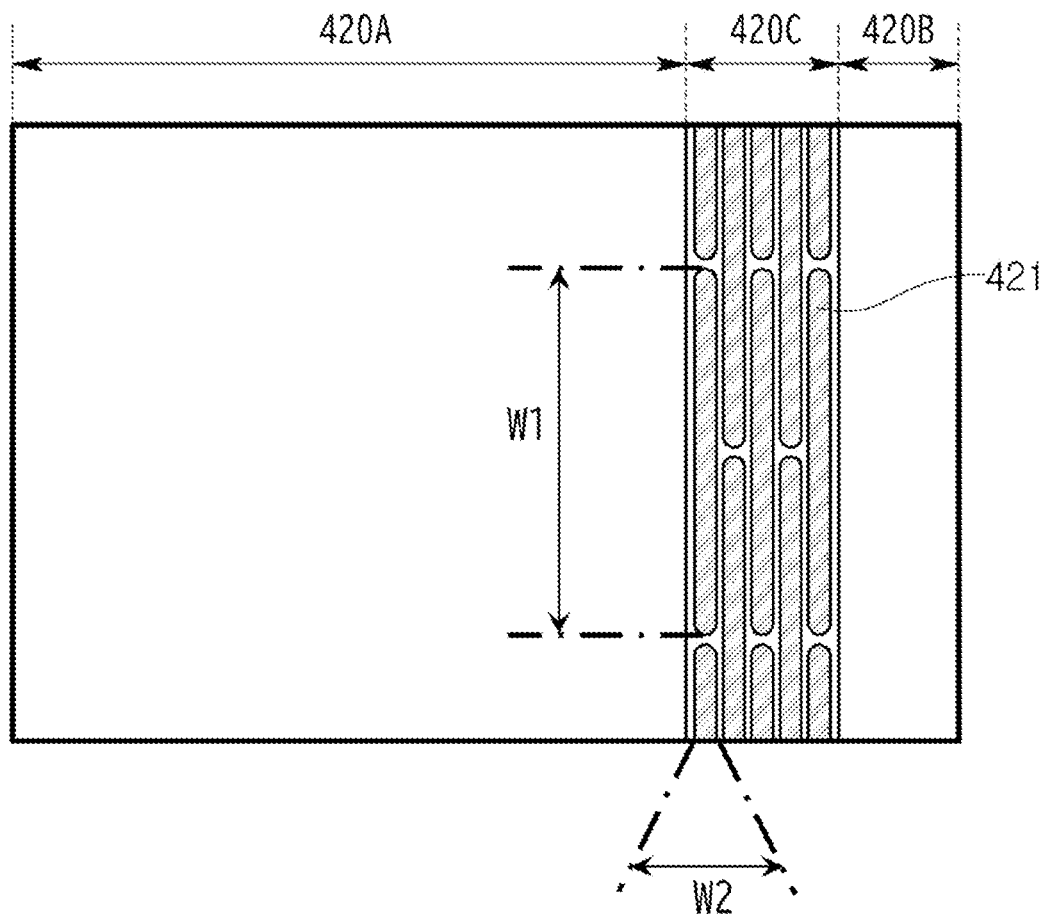
FIG. 5 is a plan view schematically illustrating a backplate of FIG. 4 according to one embodiment.

FIG. 4 is a partial cross-section view schematically showing a flexible organic light-emitting display apparatus according to another embodiment of the disclosure, and FIG. 5 is a plan view for describing a backplate 420 in an unbent state.

Referring to FIG. 4, a flexible substrate 410 may include a first area 401 corresponding to a plurality of display pixels, a bending area 402 extending from one side of the first area 401, and a second area 403 extending from one side of the bending area 402 away from the first area 401 and facing at least a portion of the first area 401. The first area 401 may be defined as a non-bending area including the active area A/A, and the second area 403 may be defined as a non-bending area including the inactive area and placed opposite the first area 401 with respect to the bending area.

The backplate 420 may be provided in a lower portion, of the flexible organic light-emitting display apparatus 400 (e.g., on the rear surface of the flexible substrate 410) to increase the strength and/or solidity of the flexible substrate 410. The backplate 420 may include a first portion 420A corresponding to the first area 401 of the flexible substrate 410, a bending portion 420C corresponding to the bending area 402, and a second portion 420B corresponding to the second area 403. The bending portion 420C may have a bending structure 421. The backplate 420 may include a material such as polyethylene terephthalate (PET), cyclic olefin polymer (COP), and triacetyl cellulose (TAC) like that according to the embodiment of FIG. 3. In the second area 403, a printed circuit board 488, rigid or flexible, may be attached on the flexible substrate 410.

Referring to FIG. 5, the backplate 420 placed on the rear surface of the flexible substrate 410 in FIG. 4 includes the bending structure 421 in the bending portion 420C. The bending structure 421 may be provided in the form of a plurality of slit patterns penetrating the backplate 420 as the material of the backplate 420 is patterned. Thus, the first portion 420A, second portion 420B, and the bending portion 420 are made of the same material, but the bending portion 420 is more bendable than the first portion 420A and the second portion 420B due to having the plurality of slits 420. In this case, the plurality of slit patterns may be shaped like discontinuous lines. When the bending structure 421 is shaped like the lines, the bending structure 421 may be disposed in parallel with the bending axis of the bending area 402. The slit patterns of the bending structure 421 may include a width W1 in a first direction parallel with the bending axis, and a width W2 in a second direction perpendicular to the first direction. The width W1 of the bending structure 421 in the first direction may be less than the width of the flexible substrate 410 in a folding axial direction, and may be formed throughout the bending portion 420C of the backplate 420. For example, the width W1 of the bending structure 421 in the first direction may be less than 10% of the width in the folding axial direction. For example, the width W1 in the bending structure 421 in the first direction may be 5.0 mm or less. The width W2 of the bending structure 421 in the second direction may be less than the width of the flexible substrate 410 in the direction perpendicular to the folding axis, (e.g., the width of the bending area). For example, the width W2 of the bending structure 421 in the second direction may be less than 15% of the width in the bending area. For example, the width W2 of the bending structure 421 in the second direction may be 0.2 mm or less. In other words, the width W1 of the bending structure 421 in the first direction may be at least 25 times greater than the width W2 in the second direction.

The plurality of slit patterns are disposed being spaced apart at a certain distance from each other. A distance between adjacent slit patterns of the plurality of slit patterns in a first direction parallel with the bending axis is greater than a distance of the adjacent slit patterns in a second direction perpendicular to the bending axis.

The distance between the bending structures 421 in the second direction may be less than the width of the bending structure 421 in the second direction. Each end of the bending structure 421 may have a semicircular shape having a predetermined curvature. For example, if the end of the bending structure 421 is rectangularly formed, stress may be concentrated at opposite end corners of the bending structure 421 when the flexible substrate 410 is bent. However, when the end of the bending structure 421 is rounded to have a predetermined curvature, the stress is more dispersed than that of when each end of the bending structure 421 is rectangularly formed. For example, the stress of about 29 Mpa is generated when the end of the bending structure 421 is rectangularly formed. On the other hand, the stress of about 14 Mpa is generated when the end of the bending structure 421 is rounded. The bending structure 421 may be shaped like a mesh, but not limited thereto. Alternatively, the bending structure 421 may have various shapes.

As the backplate 420 shaped like a mesh is provided on the rear of the bending area 402 of the flexible substrate 410, it is possible to reduce damage or deformation when an external impact or the like is applied to the bending area 402 of the flexible substrate 410 as described in the embodiment of FIG. 3. In other words, it is possible to reduce a crack of the flexible substrate 410 or disconnection of the wiring in the bending area 402. Further, it is possible to support the flexible substrate 410 and maintain a bending shape.

To securely fasten the first portion 420A and the second portion 420B of the backplate 420, an adhesive layer 440 may be provided between the first portion 420A and the second portion 420B.

The adhesive layer 440 may include a pressure-sensitive adhesive, a foam-type adhesive, a liquid adhesive, and a light cured adhesive or other suitable adhesive materials. According to some embodiments, the adhesive layer 440 may be made of a compressible material, or the compressible material may function as a cushioning material for a portion adhered by the adhesive layer 440.

A protection layer 484 may be further provided on the bending area 402 of the flexible substrate 410. The protection layer 484 may also extend from the bending area 402 to part of the first portions 420A and 420B. The protection layer 484 may be a flexible material such as resin, plastic or rubber but it is not limited to these material.

When the flexible substrate 410 is bent, tensile pressure is applied to an outer surface of the flexible substrate 410, and compressive pressure is applied to an inner surface. Therefore, the wiring provided on the bending area 402 of the flexible substrate 410 is subjected to the tensile pressure, and therefore a problem may arise in that the wiring is disconnected. This is because the winging is more vulnerable to the tensile pressure than the compressive pressure.

By applying the protection layer 484 to the bending area 402, the flexible substrate 410 in the bending area 402 is increased in thickness as much as the thickness of the protection layer, and therefore the position of a neutral surface is moved up to the position where the wiring is formed.

The neutral surface refers to a surface on which neither the tensile pressure nor the compressive pressure acts even though tensile pressure is applied to the outer surface of the flexible substrate 410 and compressive pressure is applied to the inner surface when the flexible substrate 410 is bent. Further, the flexible substrate 410 is increased in thickness by applying the protection layer 484, and the position of the neutral surface that is free from the tensile pressure of the outer surface and the compressive pressure of the inner surface of the flexible substrate 410 is moved. The neutral surface may be varied depending on the properties or thickness of materials applied as the protection layer 484, and a curing method.

A polarization plate 460 may be provided on the first area 401 of the flexible substrate 410 to control display characteristics (e.g., external light reflection, color accuracy, brightness, etc.) of the flexible display apparatus 400. Further, a cover member 480 may be used on the polarization plate 460 to protect the flexible display apparatus 400.

An electrode for detecting a user's touch input may be formed inside one surface of the cover member 480 and/or at least one surface of the polarization layer 460. As necessary, a touch detection electrode and/or an independent layer including other parts related to touch input detection (hereinafter, referred to as a touch detection layer 462) may be provided inside the flexible display apparatus 400.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical spirit of the present disclosure. The scope of the technical spirit of the present disclosure is not limited thereto. The features of various embodiments of the disclosure may be partially or fully coupled or combined with each other, and may be technically variously linked and operated by those skilled in the art, and the embodiments may be implemented independently of each other or together under a relationship. The protective scope of the present disclosure should be construed based on the following claims, and all the technical concepts in the equivalent scope thereof should be construed as falling within the scope of the present disclosure the disclosure.

What is claimed is:

1. A flexible organic light-emitting display apparatus comprising:
    a substrate comprising a first area including a plurality of pixels, a bending area that is bent and extends from one side of the first area, and a second area that extends from one side of the bending area and faces at least a portion of the first area; and
    a backplate on a rear of the substrate and in contact with the rear of the substrate, the backplate comprising a bending structure that reduces stress applied to the bending area of the substrate and repulsive force while the bending area of the substrate is bent,
    wherein the bending structure comprises a plurality of slit patterns formed to penetrate the backplate by partially removing a material forming the backplate.

2. The flexible organic light-emitting display apparatus of claim 1, wherein the bending structure overlaps bending area of the substrate.

3. The flexible organic light-emitting display apparatus of claim 1, wherein the plurality of slit patterns include linear shapes that are parallel with a bending axis of the substrate along which the bending area is bent.

4. The flexible organic light-emitting display apparatus of claim 3, wherein each of the plurality of slit patterns are spaced apart from each other by a predetermined distance.

5. The flexible organic light-emitting display apparatus of claim 4, wherein a predetermined distance between each of the plurality of slit patterns is in a first direction that is parallel with the bending axis is greater than a predetermined distance between each of the plurality of slit patterns in a second direction perpendicular to the bending axis.

6. The flexible organic light-emitting display apparatus of claim 5, wherein a width of each of the plurality of slit patterns in the first direction is at least 25 times greater than a width in the second direction.

7. The flexible organic light-emitting display apparatus of claim 5, wherein a width of the slit pattern in the first direction is less than 10% of a width of the substrate in the first direction.

8. The flexible organic light-emitting display apparatus of claim 5, wherein a width of the slit pattern in the second direction is less than 15% of the width of the bending area in the second direction.

9. The flexible organic light-emitting display apparatus of claim 5, wherein a distance between adjacent slit patterns of the plurality of slit patterns in the second direction is smaller than a width of the slit pattern in the second direction.

10. The flexible organic light-emitting display apparatus of claim 5, wherein each end of the slit pattern is rounded to have a predetermined curvature.

11. The flexible organic light-emitting display apparatus of claim 1, wherein the backplate comprises a first portion that overlaps the first area, a bending portion that overlaps the bending area, and a second portion that overlaps the second area.

12. The flexible organic light-emitting display apparatus of claim 11, further comprising:

an adhesive layer disposed between the first portion and the second portion of the backplate.

13. The flexible organic light-emitting display apparatus of claim 12, wherein the adhesive layer comprises at least one of a pressure-sensitive adhesive, a foam-type adhesive, a liquid adhesive, or a light cured adhesive.

14. The flexible organic light-emitting display apparatus of claim 1, further comprising:
a protection layer on the bending area of the substrate.

15. The flexible organic light-emitting display apparatus of claim 14, further comprising:
a touch screen panel, a polarization plate, and a cover member on the first area of the substrate.

16. A flexible organic light-emitting display apparatus comprising:
a substrate comprising a first area including a plurality of pixels, a second area that faces the first area and including a pad portion, and a bending area that is bent and is between the first area and the second area, the bending area including a plurality of wires that extend from the first area to the second area; and
a backplate in contact with a surface of the substrate, the backplate including a first portion that overlaps the first area of the substrate, a second portion that overlaps the second area of the substrate, and a bendable backplate portion that overlaps the bending area of the substrate, the bendable backplate portion more bendable than the first portion and the second portion of the backplate.

17. The flexible organic light-emitting display apparatus of claim 16, wherein the bendable backplate portion comprises a plurality of slits.

18. The flexible organic light-emitting display apparatus of claim 17, wherein the plurality of slits include linear shapes that are parallel with a bending axis of the substrate along which the bending area is bent.

19. The flexible organic light-emitting display apparatus of claim 17, wherein the first portion, the second portion, and the bendable backplate portion comprise a same material.

20. The flexible organic light-emitting display apparatus of claim 19, further comprising:
an adhesive layer including a first end and a second end that is opposite the first end, the first end in contact with the first portion of the backplate and the second end in contact with the second end of the backplate.

21. The flexible organic light-emitting display apparatus of claim 19, further comprising:
a protection area overlaps an entirety of the bending area of the substrate.

22. The flexible organic light-emitting display apparatus of claim 21, wherein the protection area extends to a portion of the first area and the second area of the substrate.

23. The flexible organic light-emitting display apparatus of claim 19, further comprising:
a touch screen panel, a polarization plate, and a cover member on the first area of the substrate.

* * * * *